United States Patent
Snyder et al.

(10) Patent No.: US 7,221,187 B1
(45) Date of Patent: *May 22, 2007

(54) PROGRAMMABLE MICROCONTROLLER ARCHITECTURE (MIXED ANALOG/DIGITAL)

(75) Inventors: Warren Snyder, Snohomish, WA (US); Monte Mar, Issaquah, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 84 days.

This patent is subject to a terminal disclaimer.

(21) Appl. No.: 10/803,030

(22) Filed: Mar. 16, 2004

Related U.S. Application Data

(63) Continuation of application No. 09/924,734, filed on Aug. 7, 2001, now Pat. No. 6,724,220.

(60) Provisional application No. 60/243,708, filed on Oct. 26, 2000.

(51) Int. Cl.
*H01L 25/00* (2006.01)
*H03K 19/177* (2006.01)

(52) U.S. Cl. ............................................ 326/41; 326/47
(58) Field of Classification Search ............. 326/37–47
See application file for complete search history.

(56) References Cited

U.S. PATENT DOCUMENTS

| | | | |
|---|---|---|---|
| 5,202,687 A | 4/1993 | Distinti | 341/158 |
| 5,426,378 A | 6/1995 | Ong | 362/39 |
| 5,703,871 A | 12/1997 | Pope et al. | 370/248 |
| 5,828,693 A | 10/1998 | Mays et al. | 375/202 |
| 5,880,598 A | 3/1999 | Duong | 326/41 |
| 6,018,559 A | 1/2000 | Azegami et al. | |
| 6,144,327 A * | 11/2000 | Distinti et al. | 341/126 |
| 6,304,101 B1 | 10/2001 | Nishihara | 326/41 |

OTHER PUBLICATIONS

"Digital Configurable Macro Architecture"; U.S. Appl. No. 09/909,045, filed Jul. 18, 2001; W. Snyder.

(Continued)

*Primary Examiner*—Anh Q. Tran

(57) ABSTRACT

A microcontroller with a mixed analog/digital architecture including multiple digital programmable blocks and multiple analog programmable blocks in a communication array having a programmable interconnect structure. The single chip design is implemented by integration of programmable digital and analog circuit blocks that are able to communicate with each other. Robust analog and digital blocks that are flash memory programmable can be utilized to realize complex design applications that otherwise would require multiple chips and/or separate applications. The programmable chip architecture includes a novel array having programmable digital blocks that can communicate with programmable analog blocks using a programmable interconnect structure. The programmable analog array contains a complement of Continuous Time (CT) blocks and a complement of Switched Capacitor (SC) blocks that can communicate together. The analog blocks consist of multi-function circuits programmable for one or more different analog functions, and fixed function circuits programmable for a fixed function with variable parameters. The digital blocks include standard multi-function circuits and enhanced circuits having functions not included in the standard digital circuits. The programmable array is programmed by flash memory and programming allows dynamic reconfiguration. That is, "on-the-fly" reconfiguration of the programmable blocks is allowed. The programmable analog array with both Continuous Time analog blocks and Switched Capacitor analog blocks are offered on a single chip along with programmable digital blocks. The programmable interconnect structure provides for communication of input/output data between all analog and digital blocks.

20 Claims, 4 Drawing Sheets

OTHER PUBLICATIONS

"Configuring Digital Functions in a Digital Configurable Macro Architecture"; U.S. Appl. No. 09/909,109, filed Jul. 18, 2001; W. Snyder.

"A Programmable Analog System Architecture (as Amended)"; U.S. Appl. No. 09/909,047, filed Jul. 18, 2001; M. Mar.

"Programmable System on a Chip"; U.S. Appl. No. 10/033,027, filed Oct. 1, 2001; W. Snyder.

* cited by examiner

PROGRAMMABLE MICROCONTROLLER ARCHITECTURE (MIXED ANALOG/DIGITAL)

RELATED U.S. APPLICATION

This is a continuation of application(s) Ser. No. 09/924,734 filed on Aug. 7, 2001, now U.S. Pat. No. 6,724,220 which is hereby incorporated by reference to this specification This application claims priority to the provisional U.S. patent application Ser. No. 60/243,798, "Advanced Programmable Microcontroller Device," with filing date Oct. 26, 2000, and assigned to the assignee of the present application.

BACKGROUND OF THE INVENTION

1. Field of the Invention

The present invention relates to the field of microcontrollers. More particularly, the present invention relates to the integration of programmable analog circuits and programmable digital circuits on a single semiconductor chip.

2. Related Art

Microcontrollers may have embedded processors, memories and special function analog and digital circuits. Typical analog circuits found in prior art microcontrollers include Continuous Time (CT) amplifiers having preset functions with given functional parameters. For instance, a CT analog amplifier might be configured as a fixed function circuit, such as a voltage amplifier, in which certain parameters, such as gain or bandwidth might be altered by programming.

Switched Capacitor (SC) analog circuits are also frequently incorporated into microcontroller designs. SC analog circuits in prior art are somewhat more versatile than CT analog circuits in that it might be possible to alter both the circuit function as well as the parameters of the circuit function by programming. However, both CT and SC analog circuits found in current microcontrollers generally require programming before utilization, and neither can be dynamically programmed (programmed "on-the-fly").

In the conventional art, general purpose digital circuits are frequently included in a microcontroller implementation. Such digital circuits are pre-programmed to realize certain digital functions such as logical operations, arithmetical functions, counting, etc. These digital circuits are generally in the form of a Programmed Logic Array (PLA) or FPGA. Furthermore, such digital circuits that require pre-programming are generally not dynamically programmable (programmable "on-the-fly"). The main difficulty here is in the generality of such a digital circuit, which requires an excessive amount of digital logic, which in turn occupies a large area on a semiconductor chip as well as an increased cost of manufacturing.

Several other design considerations related to microcontroller utilization either go unaddressed, or require separate functionalities to enable them. For instance, existing designs do not offer a programmable analog circuit array with both CT analog circuits and SC analog circuits on the same semiconductor chip with a programmable array of digital circuits. As a result, realization of a function requiring complex communication between analog circuits and digital circuits often requires the use of multiple semiconductor chips. Further, existing microcontroller realizations generally require pre-programming and cannot be dynamically programmed.

What is needed is a method and/or system which can be dynamically programmed to complete a complex communication interface between analog circuits and digital circuits in order to realize a desired microcontroller circuit function. What is also needed is a method and/or system that can utilize both CT and SC analog circuits implemented along with digital circuits on a single semiconductor chip. Further, what is needed is a method and/or system in which the functions and/or function parameters of the analog circuits and the digital circuits can be reconfigured by dynamic programming (programming "on-the-fly"). Further still, what is needed is a circuit and/or system in which a reduction of the digital logic implemented to realize a dynamically programmable digital circuit results in a reduction in required semiconductor chip area.

SUMMARY OF THE INVENTION

Accordingly, the present invention provides a microcontroller consisting of programmable analog blocks and programmable digital blocks interconnected with a programmable interconnect structure fabricated on a single semiconductor chip. A programmable mixed analog/digital architecture offers an excellent analog and digital interface that solves many design needs. The present design provides the complex communication interface between digital and analog blocks that can be reconfigured on-the-fly. The programmable analog array with both Continuous Time (CT) analog blocks and Switched Capacitor (SC) analog blocks are realized on the same semiconductor chip with programmable digital blocks.

A microcontroller with a mixed programmable analog/digital architecture including multiple digital programmable blocks and multiple analog programmable blocks in a communication array having a programmable interconnect structure is described. The single chip design is implemented by integration of programmable digital and analog circuit blocks that are able to communicate with each other. Robust analog and digital blocks that are flash memory programmable can be utilized to realize complex design applications that otherwise would require multiple chips and/or separate applications. The programmable microcontroller architecture includes a novel array having programmable digital blocks that can communicate with programmable analog blocks using a programmable interconnect structure. The programmable analog array contains a complement of Continuous Time (CT) blocks and a complement of Switched Capacitor (SC) blocks that can communicate together. The analog blocks consist of multi-blocks that can communicate together. The analog blocks consist of multi-function circuits programmable for one or more different analog functions, and fixed function circuits programmable for a fixed function with variable parameters. The digital blocks include standard multi-function circuits and enhanced circuits having functions not included in the standard digital circuits. The programmable array is programmed by flash memory and programming allows dynamic reconfiguration. That is, "on-the-fly" reconfiguration of the programmable blocks is allowed. The programmable analog array with both Continuous. Time analog blocks and Switched Capacitor analog blocks are offered on a single chip along with programmable digital blocks. The programmable interconnect structure provides for communication of input/output data between all analog and digital blocks.

More specifically, a first embodiment of the present invention includes a number of programmable analog circuit blocks configured to provide various analog functions, and a number of programmable digital circuit blocks configured to provide various digital functions. A programmable interconnect structure comprising a routing matrix and an independent bus provides coupling between analog circuit blocks, digital circuit blocks and external devices. Flash memory is used to program the interconnect structure as well as the analog circuit blocks and the digital circuit blocks. Programming can be accomplished dynamically to reconfigure any of the programmable blocks or the interconnect structure.

A complement of Continuous Time (CT) analog circuit blocks and a complement of Switched Capacitor (SC) analog circuit blocks are configured to communicate with one another as well as with external devices by means of the interconnect structure. Dynamic or "on-the-fly" programming of the interconnect structure is used to direct data between both analog circuit blocks and digital circuit blocks as well as any external devices coupled to the semiconductor chip. A number of the analog circuit blocks are multifunction circuits that can be reconfigured by dynamic programming ("on-the-fly" programming) to perform a number of differing functions. Some of the analog circuit blocks are capable of only a single function, but dynamic or "on-the-fly" programming can reconfigure the parameters of the function. Standard digital circuit blocks are configured to perform various digital operations including logical decisions and arithmetical computations. Enhanced digital circuit blocks are configured similarly to the standard digital circuit blocks and have additional digital functions available. Both standard and enhanced digital circuit blocks are reconfigurable by dynamic or "on-the-fly" programming.

DETAILED DESCRIPTION OF THE INVENTION

Figure 1:
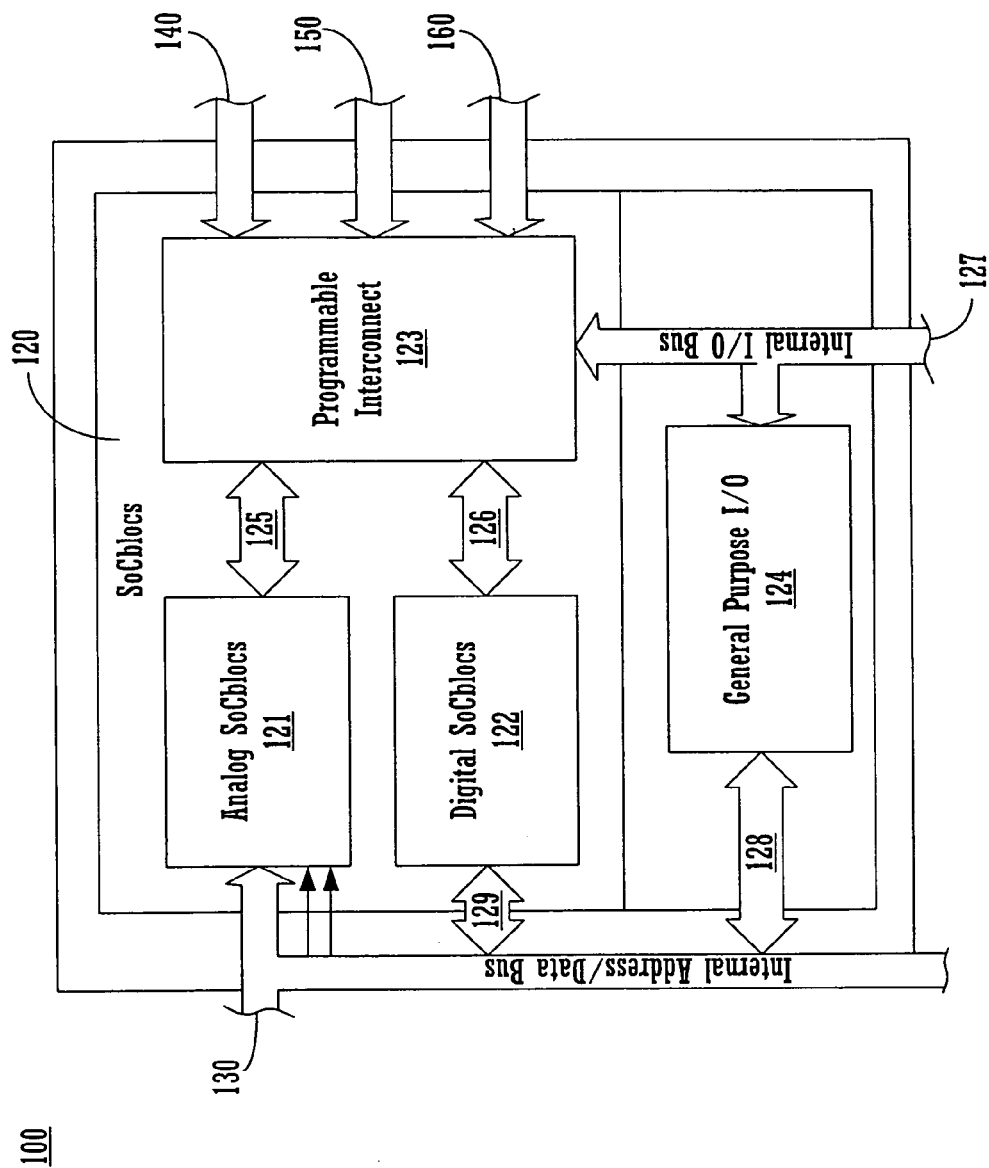
FIG. 1 is a block diagram illustrating the architecture of a programmable array according to the present invention.

Reference will now be made in detail to the preferred embodiments of the invention, a programmable mixed analog/digital architecture, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Notation and Nomenclature

Some portions of the detailed descriptions which follow may be presented in terms of procedures, logic blocks, processing, and other symbolic representations of operations on data bits within a microcontroller, or other electronic device. These descriptions and representations are used by those skilled in the electronic arts to most effectively convey the substance of their work to others skilled in the art. A procedure, logic block, process, etc., is here, and generally, conceived to be a self-consistent sequence of steps or instructions leading to a desired result. The steps are those requiring physical manipulations of physical quantities. Usually, though not necessarily, these quantities take the form of electrical, electronic, or magnetic signals capable of being stored, transferred, combined, compared, and otherwise manipulated in an electronic system. It has proven convenient at times, principally for reasons of common usage, to refer to these signals as bits, bytes, values, elements, symbols, characters, terms, numbers, streams, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "adjusting," "ascertaining," "calculating," "changing," "commanding," "communicating," "conducting," "controlling," "determining," "dividing," "executing," "forming," "generating," "intercommunicating," "monitoring," "multiplexing," "performing," "programming," "registering," "repeating," "sensing," "setting," "supplying," or the like, refer to the action and processes of microcontrollers, or similar intelligent electronic and/or microelectronic devices, that manipulate(s) and transform(s) data and signals represented as physical (electronic and electrical) quantities within the devices' registers and subcomponents into other data and signals similarly represented as physical quantities within the device subcomponents and registers and other such information storage, transmission or display capabilities.

Exemplary Circuits and Systems

Exemplary Microcontroller

The present invention provides an on-chip integration of programmable digital and analog circuit blocks in a microcontroller that are able to communicate with each other. FIG. 1 is a block diagram 100 illustrating a programmable architecture (exemplified by a programmable "system-on-a-chip" microcontroller such as the PSoC™ microcontroller, available commercially from Cypress MicroSystems, Inc., Bothell, Wash., or from the world wide web at http://www.cypressrmicro.com/), composed of programmable analog blocks 121 that can communicate with programmable digital blocks 122 by means of a programmable interconnect structure 123 and a General Purpose I/O 124. This novel architecture allows a single chip solution to perform numerous complex activities that would otherwise require multiple chips or separate applications. The dashed line 120 encloses the four major components 121, 122, 123 and 124 constructed on the single semiconductor chip. An important aspect of the present invention is the integration of both programmable analog circuits and programmable digital circuits on the same semiconductor chip.

The Analog System on a Chip Block (SoCbloc) 121 is coupled 125 to the Programmable Interconnect 124, and it is also coupled to the Internal Address/Data Bus 130. In one embodiment of the present invention, the Analog SoCbloc 121 consists of four Analog Continuous Time (ACT) amplifiers, four type 1 Switched Capacitor (SC1) amplifiers and four type 2 Switched Capacitor (SC2) amplifiers, all of which are dynamically programmable. Dynamic programming allows for "on-the-fly" modification of analog amplifier fixed function parameters such as gain, bandwidth and frequency response. In addition, dynamic programming can be used to change the function of certain analog amplifiers, such as causing an amplifier function to change from simple voltage amplification to digital-to-analog conversion.

The Digital SoCbloc 122 is coupled 126 to the Programmable Interconnect 124 and it is also coupled 129 to the Internal Address/Data Bus 130. In one embodiment of the present invention, the Digital SoCbloc 122 consists of four Standard Multi-Function (MFBs) digital circuits and four Enhanced Multi-Function (MFBe) digital circuits, all of which are dynamically programmable. Dynamic programming allows for "on-the-fly" modification of digital circuit parameters as well as functions. For instance, programming a digital circuit to perform a logical operation, and reprogramming at a later time to perform a digital counting operation.

The Programmable Interconnect 123 is dynamically programmable and can be used to couple any analog amplifier to any digital circuit. The Programmable Interconnect 123 is also used to route data between the Internal I/O Bus 127 and the Internal Address/Data Bus 130 as well as the General Purpose I/O unit 124 which is coupled 128 to the Internal Address/Data Bus 130. Analog Clock signals 140, Interrupt Controller signals 150 and System Clock signals 160 are connected via the Programmable Interconnect 123 for signal routing as well as dynamic programming of Analog SoCblocks 121 and Digital SoCblocs 122.

Exemplary Hardware Routing Resources

Figure 2:
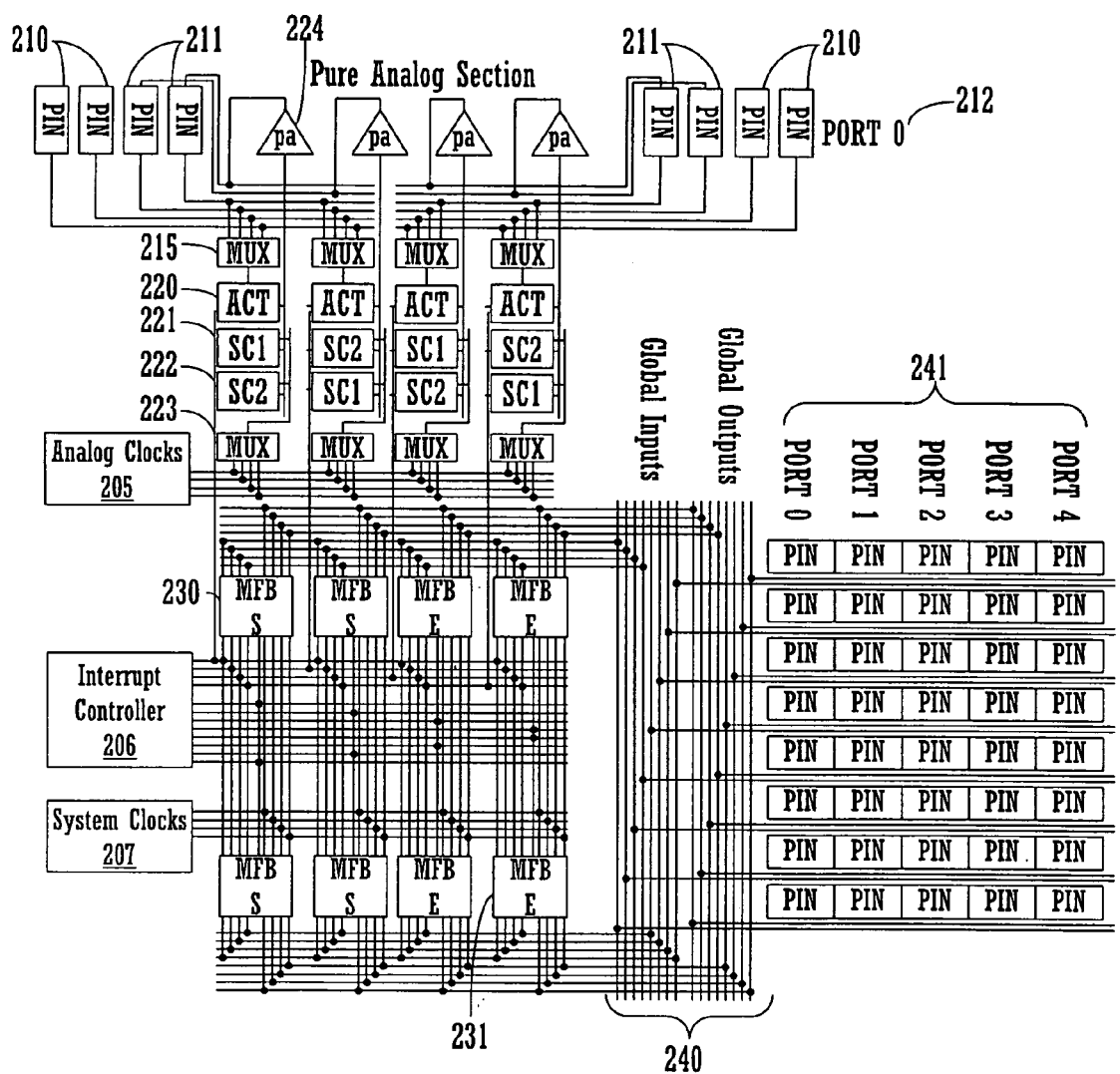
FIG. 2 illustrates one embodiment of the hardware routing resources of a programmable architecture according to the present invention.

FIG. 2 illustrates one embodiment of the hardware routing resources 200 of the programmable chip architecture according to the present invention. Twelve analog amplifier circuits, four ACT circuits 220, four SC1 circuits 221 and four SC2 circuits 222, correspond to the Analog SoCblocs 121 illustrated in FIG. 1. Analog signals are coupled to the semiconductor chip at port 0, 212, which consists of four input pins 210 and four output pins 211.

An analog signal is coupled between port 0, 212, via a MUX 215 to an analog amplifier ACT 220, SC1, 221 or SC2, 222. These four MUX circuits 215 are contained within the Programmable Interrupt 123 illustrated in FIG. 1. An analog output signal from an analog amplifier ACT 220, SC1, 221 or SC2, 222 can be coupled through a power amplifier pa 224 to an output pin 211 in port 0, 212. The four power amplifiers pa 224 are contained within the General Purpose I/O 124 illustrated in FIG. 1.

The Analog Clocks 205 controlling MUX 223 and MUX 215 provide analog signal routing to interconnect numerous combinations of ACT 220, and SC1, 221 and SC2, 222 analog amplifier circuits. The four MUX circuits 223 are also contained within the Programmable Interrupt 123 illustrated in FIG. 1. Various interconnect combinations can be used to realize numerous complex analog functions, such as signal amplification, signal filtering, signal filter parameters such as the number and location of poles, and so on.

The analog output signal from any analog amplifier ACT 220, SC1, 221 or SC2, 222 is also made available as an input to any one of eight digital circuits, four MFBs 230 and four MFBe 231, under control of the Interrupt Controller 206. These eight digital circuits correspond to the Digital SoCblocs 122 illustrated in FIG. 1. Similarly, a digital output from any one of the eight digital circuits, four MFBs 230 and four MFBe 231, can be presented under control of the Interrupt Controller 206 as an input to any one of the twelve analog amplifiers ACT 220, SC1, 221 or SC2, 222.

The Interrupt Controller 206 and the System Clocks 207 couple digital signals between any one of the eight digital circuits, four MFBs 230 and four MFBe 231, and the Internal I/O Bus 240 which is illustrated 127 in FIG. 1. Digital signals are coupled to the semiconductor chip by means of forty (40) individual pins which form ports 0 through 4, 241.

Exemplary Digital/Analog Function

Figure 3:
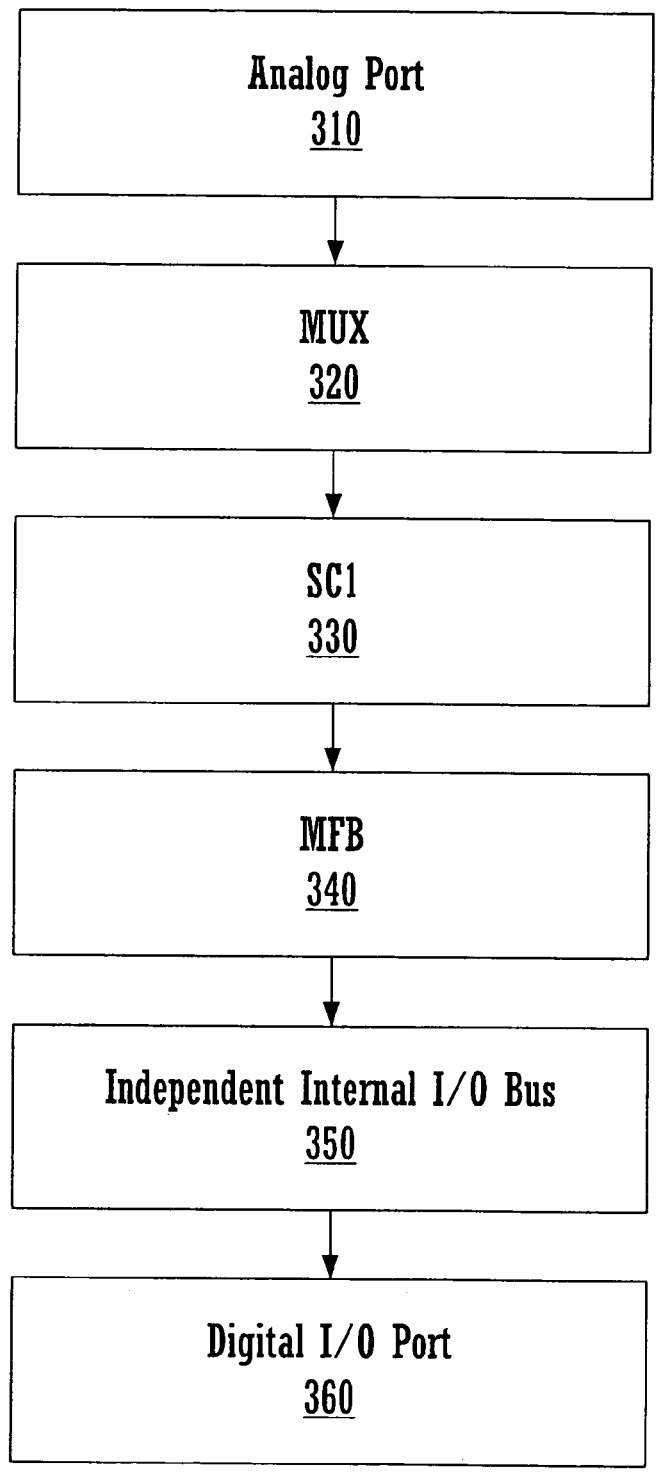
FIG. 3 is a flow chart illustrating steps in a combined digital/analog operation possible with a programmable chip according to the present invention.

FIG. 3 is a flow chart illustrating steps 300 in a combined analog/digital operation possible with a programmable array according to the present invention. Component reference numbers used are as assigned in FIG. 2. An analog signal to be digitized is presented in step 310 at one of the pins of the analog port 0, 210 in FIG. 2. Under control of the Analog Clock 205, the analog input signal is coupled in step 320 via a MUX 215 to the input of an SC1 amplifier 221 configured as an integrator with an internal comparator. In step 330, the output of the SC1 amplifier 221 is represented as a digital input signal which is applied to two MFBs 230 configured as an eight bit digital counter. Under the control of the Interrupt Controller 206 and System Clocks 207, the two MFBs 230 accumulate and store the digital conversion of the analog input signal in step 340. The resulting digital data is then coupled in step 350 via the Independent Internal I/O Bus 240 to a digital output port such as port 0, 241 in FIG. 2.

Exemplary Digital Function

Figure 4:
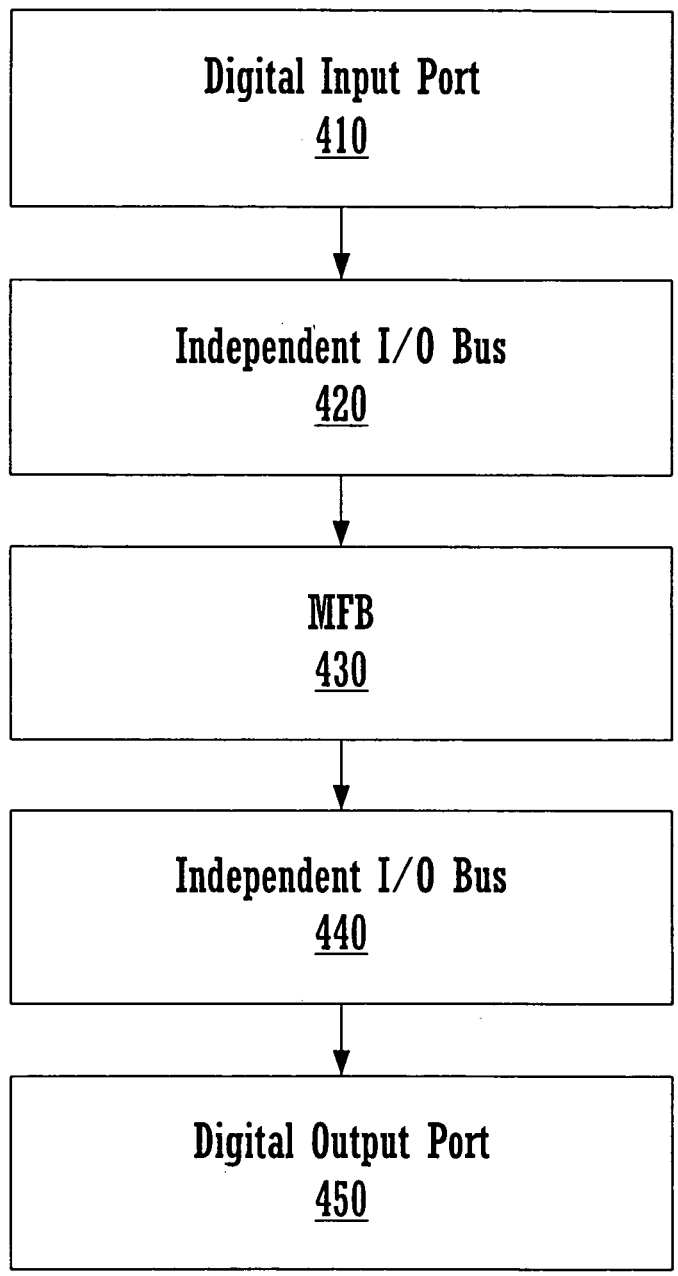
FIG. 4 is a flow chart illustrating steps in a digital operation possible with a programmable chip according to the present invention.

FIG. 4 is a flow chart illustrating steps 400 in a digital operation possible with a programmable array according to the present invention. Component reference numbers used are as assigned in FIG. 2. In the present example, a series of pulses taken from an external device are to be counted and a signal is to be coupled to an output device when the count is found to be equal to a preset value. In step 410, the external series of pulses is coupled to a predetermined port and pin, such as pin 1 of port 0, 241 in FIG. 2. In step 420, the Independent Internal I/O Bus 240 is used to couple the input signal to an MFB 230. Under control of the Interrupt Controller 206 and the System Clocks 207, the MFB 230 counts pulses in sequence and compares the count to a stored preselected count. When the accumulated count equals the stored count, the MFB generates a signal which is coupled in step 450 to a preselected output port and pin by the Independent Internal I/O Bus 240. It is to be appreciated that a series of pulses taken from an external device that are not satisfactory digital signals could be entered as an analog signal which is then routed through an analog amplifier ACT 220, SCI 221 or SC2 222 in order to produce a digital signal that is then routed to a designated MFB 230.

The preferred embodiment of the present invention, a programmable microcontroller architecture (mixed analog/digital), is thus described. While the present invention has been described in particular embodiments, it should be appreciated that the present invention should not be construed as limited by such embodiments, but rather construed according to the below claims.

What is claimed is:
1. A circuit comprising:
a plurality of analog circuit blocks;
a plurality of digital circuit blocks;

a bus coupling analog input/output data and digital input/output data for the plurality of analog circuit blocks and the plurality of digital circuit blocks; and a system clock for controlling the coupling of the analog input/output data and the digital input output data to the bus.

2. A circuit according to claim 1 further comprising:

a programmable interconnect structure coupled to the plurality of analog circuit blocks and the plurality of digital circuit blocks.

3. A circuit according to claim 2 wherein the programmable interconnect structure is configured to dynamically reconfigure the plurality of analog circuit blocks and the plurality of digital circuit blocks to implement one of a plurality of functions.

4. A circuit according to claim 1 wherein the circuit comprises a single integrated circuit semiconductor chip.

5. A circuit according to claim 1 wherein the analog circuit blocks comprises at least one continuous time analog circuit.

6. A circuit according to claim 1 wherein the analog circuit blocks comprises at least one switched capacitor analog circuit.

7. A microcontroller comprising:

a plurality of programmable analog circuit blocks;

a plurality of programmable digital circuit blocks;

a programmable interconnect coupling the analog circuit blocks and the digital circuit blocks;

a bus coupling analog input/output data and digital input/output data for the analog circuit blocks and the digital circuit blocks; and a system clock for controlling the bus.

8. A microcontroller according to claim 7 wherein one of the digital circuit blocks is configured to implement logical operations.

9. A microcontroller according to claim 7 wherein one of the digital circuit blocks is configured to implement computational operations.

10. A microcontroller according to claim 7 wherein the programmable interconnect structure and the programmable analog circuit blocks and the plurality of programmable digital circuit blocks are constructed on a semiconductor chip.

11. A microcontroller according to claim 7 wherein the programmable analog circuit blocks comprise at least one continuous time analog circuit block.

12. A microcontroller according to claim 7 wherein the programmable analog circuit blocks comprise at least one switched capacitor analog circuit block.

13. A microcontroller according to claim 7 wherein the programmable digital circuit blocks comprise at least one digital multi-function circuit block having a first set of digital functions and at least one digital multi-function circuit block having a second set of digital functions different from the first set.

14. A method of providing a dynamically programmable analog/digital communication interface circuit, comprising:

configuring a plurality of programmable analog circuit blocks to implement at least one of a plurality of analog functions, configuring a plurality of programmable digital circuit blocks to implement at least one of a plurality of digital functions, configuring a routing matrix to couple analog data and digital data between the programmable analog circuit blocks and the programmable digital circuit blocks; and transferring data via a bus independent of the routing matrix and in accordance with at least one system clock.

15. The method according to claim 14 wherein flash memory is used to program the routing matrix and the plurality of programmable analog circuit blocks and the plurality of programmable digital circuit blocks and to enable dynamic circuit reconfiguration.

16. The method according to claim 14 wherein the programmable analog circuit blocks comprise at least one continuous time analog circuit and at least one switched capacitor analog circuit.

17. The method according to claim 14 wherein the programmable digital circuit blocks comprise at least one standard digital multi-function circuit having a first set of digital functions and at least one enhanced digital multi-function circuit having at least one function differing from the first set of digital functions.

18. The method according to claim 14 wherein the programmable analog circuit blocks comprise at least one multi-function circuit programmable for at least one of the plurality of analog functions and at least one fixed function circuit programmable for a fixed function with at least one of a number of different parameters.

19. The method according to claim 14 wherein the plurality of digital functions comprises logical operations.

20. The method according to claim 14 wherein the plurality of digital functions comprises computational operations.

* * * * *